(12) United States Patent
Tetsuka

(10) Patent No.: US 11,611,350 B2
(45) Date of Patent: Mar. 21, 2023

(54) ANALOG-TO-DIGITAL CONVERTER, WIRELESS COMMUNICATION APPARATUS, AND ANALOG-TO-DIGITAL CONVERSION METHOD

(71) Applicant: KYOCERA Corporation, Kyoto (JP)

(72) Inventor: Nobuyuki Tetsuka, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 139 days.

(21) Appl. No.: 17/357,317

(22) Filed: Jun. 24, 2021

(65) Prior Publication Data

US 2021/0320669 A1 Oct. 14, 2021

Related U.S. Application Data

(63) Continuation of application No. PCT/JP2019/049179, filed on Dec. 16, 2019.

(30) Foreign Application Priority Data

Dec. 25, 2018 (JP) .............................. JP2018-241033

(51) Int. Cl.
  *H03M 1/00* (2006.01)
  *H03M 1/12* (2006.01)
  *H04B 1/3827* (2015.01)

(52) U.S. Cl.
  CPC ......... *H03M 1/1245* (2013.01); *H04B 1/3827* (2013.01)

(58) Field of Classification Search
  CPC .................................................. H03M 1/1245
  USPC .................................................. 341/122, 155
  See application file for complete search history.

(56) References Cited

U.S. PATENT DOCUMENTS

| | | | |
|---|---|---|---|
| 5,418,533 A | 5/1995 | Knierim | |
| 2010/0207801 A1* | 8/2010 | Furuta | H03M 1/0845 341/161 |
| 2019/0137746 A1* | 5/2019 | Yabugaki | H03M 1/1255 |

FOREIGN PATENT DOCUMENTS

| | | |
|---|---|---|
| JP | S61-236219 A | 10/1986 |
| JP | H04-259117 A | 9/1992 |
| JP | H07-202694 A | 8/1995 |
| JP | H11-098016 A | 4/1999 |
| JP | H11-163725 A | 6/1999 |
| JP | 2003-318759 A | 11/2003 |
| JP | 2004-032343 A | 1/2004 |
| JP | 2006-180373 A | 7/2006 |
| JP | 2008-072406 A | 3/2008 |

(Continued)

*Primary Examiner* — Peguy Jean Pierre
(74) *Attorney, Agent, or Firm* — Studebaker & Brackett PC

(57) ABSTRACT

An analog-to-digital converter (1) includes an S/H circuit (10) configured to sample and hold an analog input signal (IN) in synchronization with a sampling clock signal (CLK), a delay circuit (20) configured to delay the sampling clock signal (CLK), an ADC circuit (30) configured to sample an output signal (S/H_out) of the S/H circuit (10) in synchronization with the sampling clock signal (CLK_delay) that is delayed, and output a digital signal (OUT) corresponding to an amplitude of the output signal that is sampled, and a delay adjustment circuit (40) configured to adjust a delay time of the sampling clock signal (CLK) in the delay circuit (20) in accordance with a change in frequency of the sampling clock signal (CLK).

7 Claims, 4 Drawing Sheets

(56) References Cited

FOREIGN PATENT DOCUMENTS

| JP | 2009-159432 A | 7/2009 |
| JP | 2009-177625 A | 8/2009 |

\* cited by examiner

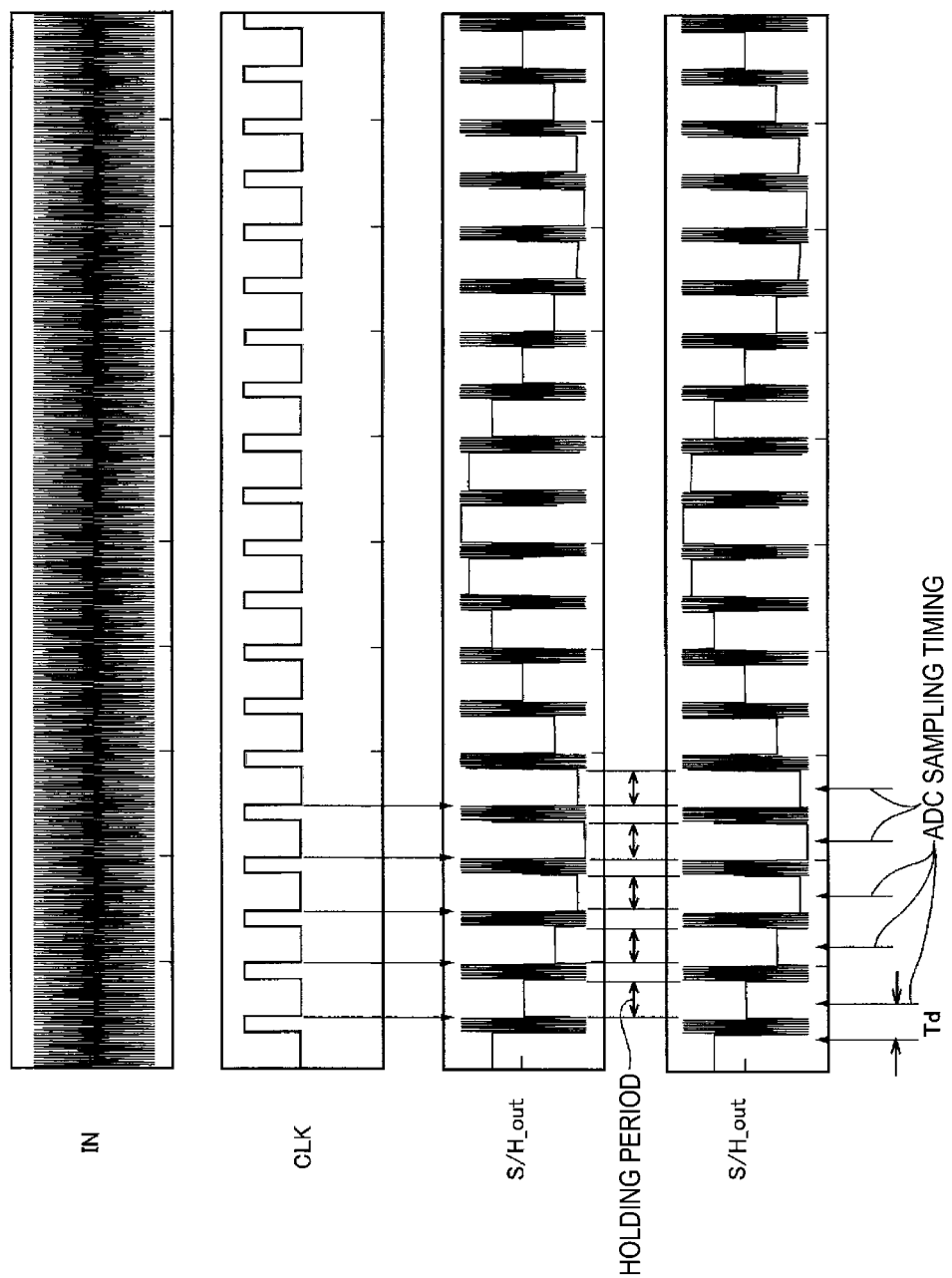

ANALOG-TO-DIGITAL CONVERTER, WIRELESS COMMUNICATION APPARATUS, AND ANALOG-TO-DIGITAL CONVERSION METHOD

RELATED APPLICATIONS

The present application is a continuation based on PCT Application No. PCT/JP2019/049179, filed on Dec. 16, 2019, which claims the benefit of Japanese Patent Application No. 2018-241033 filed on Dec. 25, 2018. The content of which is incorporated by reference herein in their entirety.

TECHNICAL FIELD

The present disclosure relates to an analog-to-digital converter, a wireless communication apparatus, and an analog-to-digital conversion method.

BACKGROUND ART

Known analog-to-digital converters in the related art include a sample-and-hold circuit for sampling and holding an analog input signal at discrete times based on a sampling rate, and an analog-to-digital converter circuit that quantifies the amplitude of the sampled signal to convert the signal into a digital signal.

Typically, by limiting the highest frequency of the analog input signal to up to ½ of the sampling rate, the original analog input signal can be reconstructed from the sampling result with no error (Nyquist sampling theorem).

In recent years, a technology called undersampling has gathered interest as a technique of sampling at a sampling rate that is less than two times the highest frequency of an analog input signal in a radio frequency (RF) band in order to perform analog-to-digital conversion on the analog input signal and perform down-converting (i.e., converting to a frequency band lower than the RF band) in wireless communication apparatuses (see, for example, Patent Document 1).

In an analog-to-digital converter that performs undersampling, a sampling rate (Fs) of two times or more the bandwidth (BW) of the analog input signal must be set and the analog input signal must be within an N-th Nyquist zone, and analog-to-digital conversion is performed on an image on the first Nyquist zone sampled under these conditions.

CITATION LIST

Patent Document

Patent Document 1: Japanese application publication No. 2008-72406 A

SUMMARY

An analog-to-digital converter according to a first aspect includes a sample-and-hold circuit configured to sample and hold an analog input signal in synchronization with a sampling clock signal, a delay circuit configured to delay the sampling clock signal, an analog-to-digital converter circuit configured to sample an output signal of the sample-and-hold circuit in synchronization with the sampling clock signal that is delayed, and output a digital signal corresponding to an amplitude of the output signal that is sampled, and a delay adjustment circuit configured to adjust a delay time of the sampling clock signal in the delay circuit in accordance with a change in frequency of the sampling clock signal.

A wireless communication apparatus according to a second aspect includes the analog-to-digital converter according to the first aspect.

An analog-to-digital conversion method according to a third aspect includes sampling and holding an analog input signal in synchronization with a sampling clock signal, delaying the sampling clock signal, sampling the signal that is held in synchronization with the sampling clock signal that is delayed, and outputting a digital signal corresponding to an amplitude of the signal that is sampled, and adjusting a delay time of the sampling clock signal in a case where the sampling clock signal is to be delayed, in accordance with a change in frequency of the sampling clock signal.

BRIEF DESCRIPTION OF DRAWINGS

FIG. 2 is a time chart illustrating operational waveforms of the analog-to-digital converter according to the embodiment.

DESCRIPTION OF EMBODIMENTS

In order for an analog-to-digital converter circuit to appropriately sample a signal output by a sample-and-hold circuit, it may be necessary to provide a delay circuit that delays a sampling clock signal to be input to the analog-to-digital converter circuit with respect to a sampling clock signal to be input to the sample-and-hold circuit.

Further, current wireless communication methods must be compatible with various bands (carrier frequencies) and wide bandwidths (e.g., 100 MHz or higher). Therefore, in order to perform undersampling, the frequency of the sampling clock signal (i.e., the sampling rate) may be changed according to the frequency and bandwidth of the analog input signal.

However, if a delay time in the delay circuit is constant irrespective of the sampling rate, there is a concern that analog-to-digital conversion cannot be appropriately performed.

Thus, the present disclosure makes it possible to appropriately perform analog-to-digital conversion even when the sampling rate is changed.

Embodiments will be described with reference to the drawings. In the description of the drawings, identical or similar components are denoted by the same or similar reference symbols.

Configuration of Analog-to-Digital Converter

Figure 1:
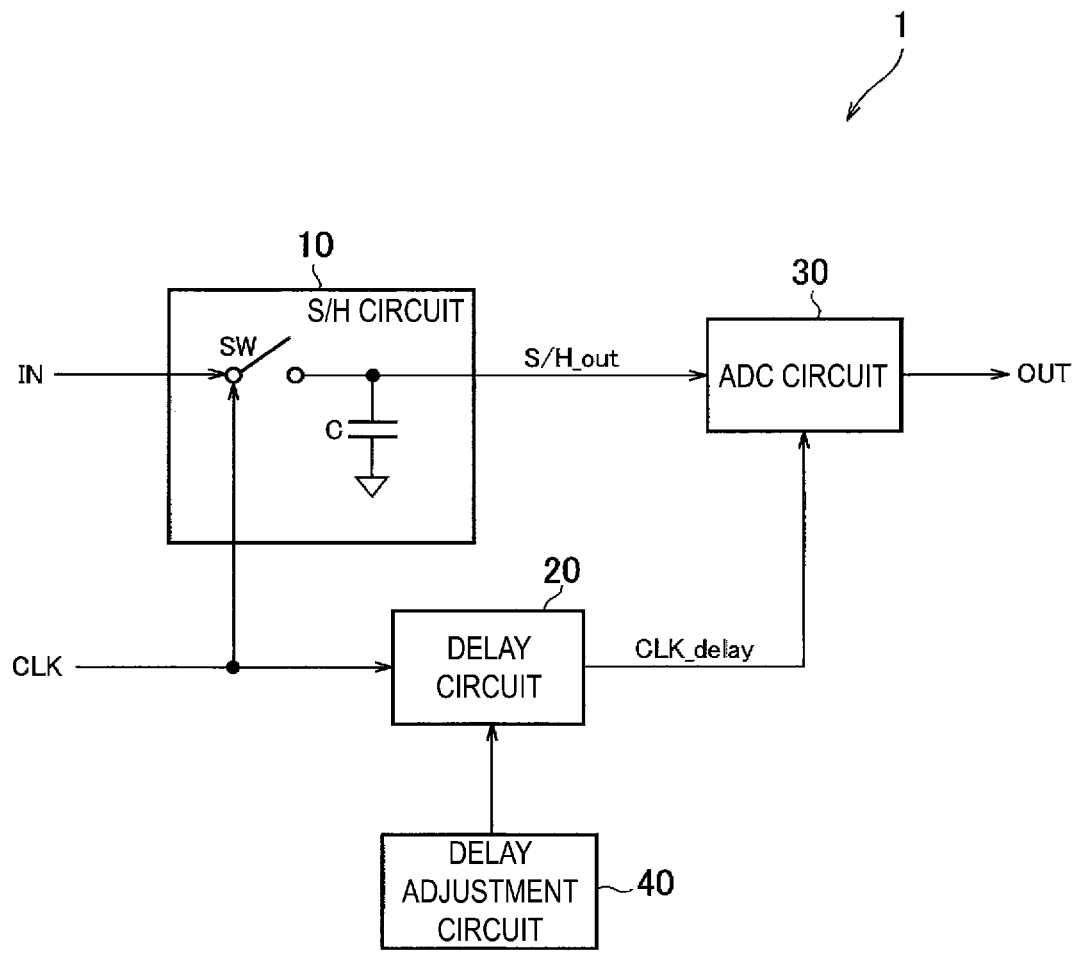
FIG. 1 is a block diagram illustrating a configuration of an analog-to-digital converter according to an embodiment.

FIG. 1 is a block diagram illustrating a configuration of an analog-to-digital converter 1 according to an embodiment. FIG. 2 is a time chart illustrating operational waveforms of the analog-to-digital converter 1 according to the embodiment. Note that in FIG. 2, the horizontal axis represents time and the vertical axis represents amplitude.

The analog-to-digital converter 1 performs undersampling to convert an RF-band analog input signal IN to a digital signal and perform down-converting (i.e., conversion to a frequency band lower than the RF band). In undersampling, sampling is performed at a sampling rate (Fs) that is less than a Nyquist frequency being two times the highest frequency of the analog input signal IN.

As illustrated in FIG. 1, the analog-to-digital converter 1 includes a sample-and-hold (S/H) circuit 10, a delay circuit 20, an analog-to-digital converter (ADC) circuit 30, and a delay adjustment circuit 40.

The analog input signal IN and a sampling clock signal CLK are input to the S/H circuit 10. As illustrated in FIG. 2, the S/H circuit 10 samples and holds the analog input signal IN in synchronization with the sampling clock signal CLK, and outputs a sampled and held signal S/H_out to the ADC circuit 30.

As illustrated in FIG. 1, the S/H circuit 10 includes a switch SW that accepts input of, for example, the analog input signal IN and the sampling clock signal CLK, and a capacitor C provided on the output side of the switch SW.

When the sampling clock signal CLK is at a high level (H level), the switch SW is in a conductive state (ON state) and outputs the analog input signal IN, as illustrated in FIG. 2. On the other hand, when the sampling clock signal CLK is at a low level (L level), the switch SW is in a non-conductive state (OFF state). The capacitor C holds voltage when the switch SW is switched from the ON state to the OFF state.

As a result, the S/H circuit 10 samples the analog input signal IN when the sampling clock signal CLK is at the H level and holds the sampled signal when the sampling clock signal CLK is at the L level, as illustrated in FIG. 2. That is, a period in which the sampling clock signal CLK is at the L level corresponds to a holding period.

The sampling clock signal CLK is input to the delay circuit 20. The delay circuit 20 delays the sampling clock signal CLK and outputs a delayed sampling clock signal CLK_delay to the ADC circuit 30. A delay time Td in the delay circuit 20 is variable, and the delay circuit 20 is configured such that the delay adjustment circuit 40 adjusts the delay time Td.

The output signal S/H_out of the S/H circuit 10 and the sampling clock signal CLK_delay delayed by the delay circuit 20 are input to the ADC circuit 30. As illustrated in FIG. 2, the ADC circuit 30 samples the output signal S/H_out in synchronization with the delayed sampling clock signal CLK_delay, and outputs a digital signal OUT corresponding to the amplitude of the sampled output signal. The ADC circuit 30 outputs the digital signal OUT having N (N≥1) bits.

The sampling timing of the ADC circuit 30 needs to be set within the holding period in which the sampled signal is held by the S/H circuit 10. Thus, when the delay time Td, which is a deviation between both sampling timings, is not appropriately set, the output signal S/H_out of the S/H circuit 10 is not properly acquired by the ADC circuit 30.

Operation of Delay Adjustment Circuit

In the analog-to-digital converter 1 that performs undersampling, a sampling rate (Fs) of two times or more the bandwidth (BW) of the analog input signal IN is set, and the analog input signal IN must be within an N-th Nyquist zone. The analog-to-digital converter 1 performs analog-to-digital conversion on an image on the first Nyquist zone sampled under those conditions.

Current wireless communication methods must be compatible with various bands (carrier frequencies) and wide bandwidths (e.g., 100 MHz or higher). Thus, the frequency (sampling rate) of the sampling clock signal CLK may be changed according to the frequency and/or bandwidth of the analog input signal IN in order to perform undersampling.

When the sampling period is changed, the holding period of the S/H circuit 10 is also changed. Thus, the delay adjustment circuit 40 adjusts the delay time Td in the delay circuit 20 in accordance with a change in frequency (sampling rate) of the sampling clock signal CLK.

The delay adjustment circuit 40 may detect a change in the sampling rate (Fs) based on the sampling clock signal CLK, or based on a control signal input from an external circuit.

The delay adjustment circuit 40 may also determine the delay time Td with reference to a table in which the sampling rate (Fs) is associated with delay times Td. Alternatively, the delay time Td may be determined by substituting a value of the sampling rate (Fs) into a predetermined calculation equation.

For example, the delay adjustment circuit 40 shortens the delay time Td in accordance with an increase in frequency of the sampling clock signal CLK. The delay adjustment circuit 40 extends the delay time Td in accordance with a decrease in frequency of the sampling clock signal CLK.

Specifically, the delay adjustment circuit 40 adjusts the delay time Td such that the ADC circuit 30 samples the output signal S/H_out in a stable region in which the output signal S/H_out of the S/H circuit 10 is stable. The stable region refers to a region corresponding to the holding period of the S/H circuit 10.

However, at a start timing or an end timing of the holding period, the output signal S/H_out may not be stable. Thus, the stable region is preferably a region around the center of the holding period. For example, in a case where one holding period is divided into three equal intervals in a time direction, the center time interval may be the stable region.

Figure 3A:
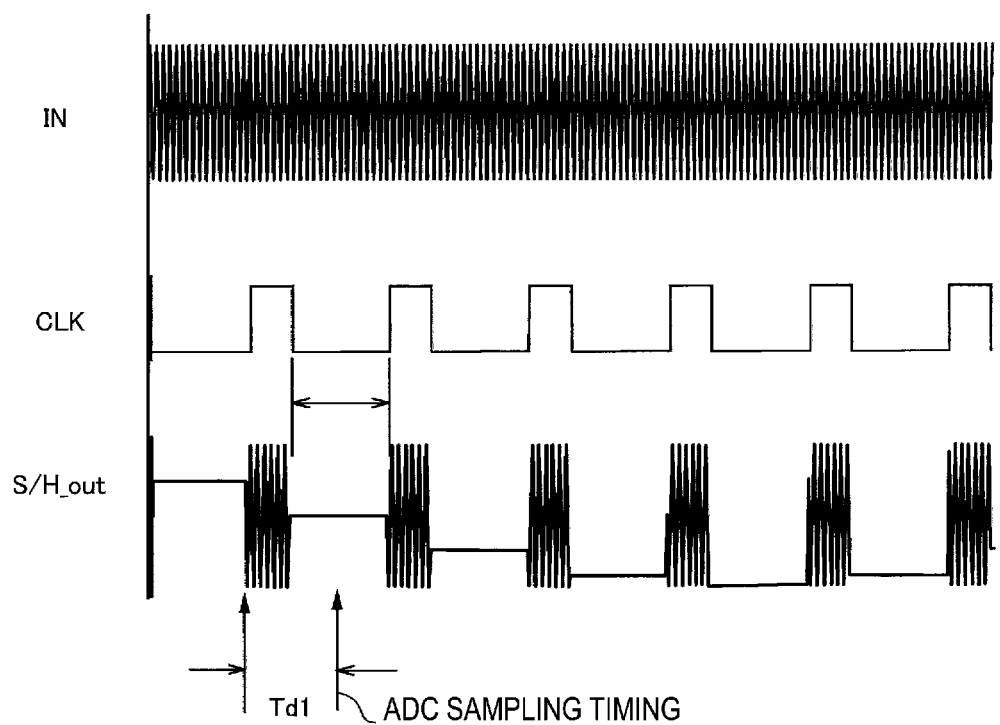
FIG. 3A is a diagram illustrating an operation example of a delay adjustment circuit according to the embodiment.
Figure 3B:
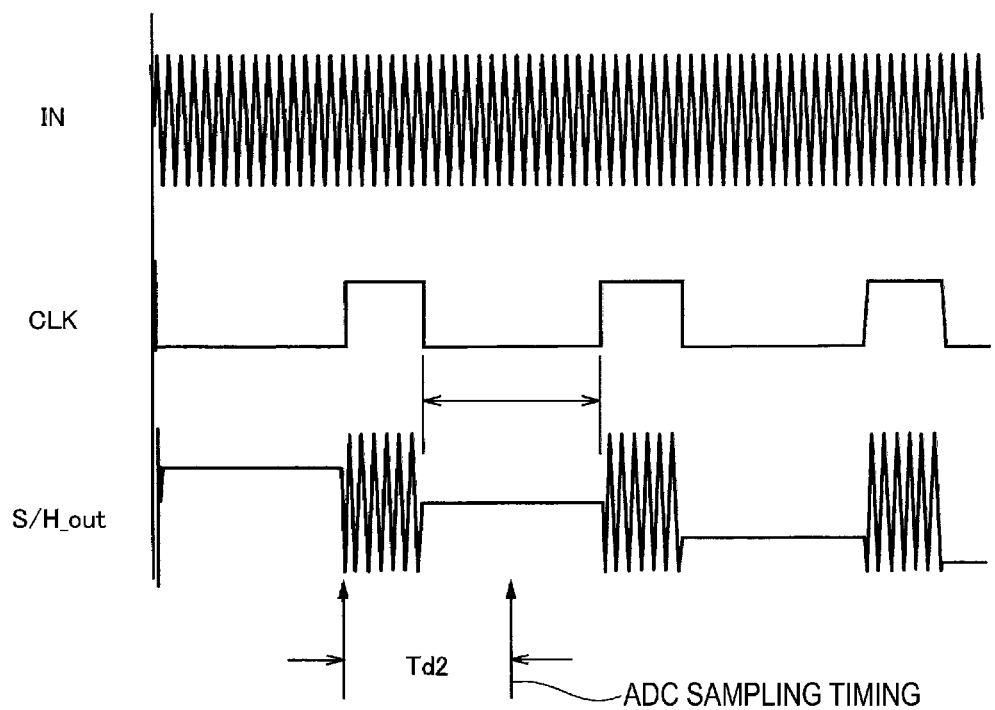
FIG. 3B is a diagram illustrating an operation example of a delay adjustment circuit according to the embodiment.

FIG. 3A and FIG. 3B are a diagram illustrating an operation example of the delay adjustment circuit 40 according to the embodiment. The sampling clock signal CLK illustrated in FIG. 3A has a higher frequency than the sampling clock signal CLK illustrated in FIG. 3B. Thus, the delay adjustment circuit 40 extends a delay time Td2 illustrated in FIG. 3B further than a delay time Td1 illustrated in FIG. 3A.

For example, in changing from the sampling clock signal CLK illustrated in FIG. 3A to the sampling clock signal CLK illustrated in FIG. 3B, the delay adjustment circuit 40 extends the delay time Td from the delay time Td1 to the delay time Td2.

On the other hand, in changing from the sampling clock signal CLK illustrated in FIG. 3B to the sampling clock signal CLK illustrated in FIG. 3A, the delay adjustment circuit 40 shortens the delay time Td from the delay time Td2 to the delay time Td1.

Other Embodiments

Figure 4:
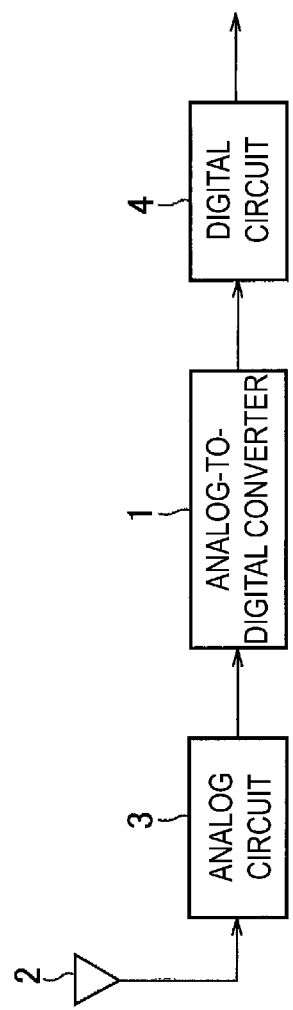
FIG. 4 is a block diagram illustrating a configuration of a receiver of a wireless communication apparatus including the analog-to-digital converter according to the embodiment.

FIG. 4 is a block diagram illustrating a configuration of a receiver of a wireless communication apparatus including the analog-to-digital converter 1 according to the embodiment described above.

As illustrated in FIG. 4, in addition to the analog-to-digital converter 1 according to the embodiment described above, the wireless communication apparatus includes an antenna 2, an analog circuit 3, and a digital circuit 4.

The antenna 2 receives a wireless signal and outputs the received wireless signal to the analog circuit 3.

The analog circuit 3 includes a low-noise amplifier (LNA) and an analog filter circuit. The analog circuit 3 outputs an RF band analog signal to the analog-to-digital converter 1.

The analog-to-digital converter 1 performs analog-to-digital conversion on the RF band analog signal input from the analog circuit 3, performs down-converting (i.e., conversion to a frequency band that is lower than the RF band), and outputs a digital signal to the digital circuit 4. The analog-to-digital converter 1 may perform down-converting to an intermediate frequency (IF) band or down-converting to a baseband (BB) band.

The digital circuit 4 includes a digital signal processor (DSP) that performs digital signal processing such as digital filtering. The digital circuit 4 performs the digital signal processing on a digital signal input from the analog-to-digital converter 1 and outputs the processed digital signal.

Note that the analog-to-digital converter 1 according to the embodiment described above may be configured as a semiconductor integrated circuit by being integrated on a semiconductor substrate.

Embodiments have been described above in detail with reference to the drawings, but specific configurations are not limited to those described above, and various design modifications can be made without departing from the gist of the present disclosure.

The invention claimed is:

1. An analog-to-digital converter comprising:
    a sample-and-hold circuit configured to sample and hold an analog input signal in synchronization with a sampling clock signal;
    a delay circuit configured to delay the sampling clock signal;
    an analog-to-digital converter circuit configured to sample an output signal of the sample-and-hold circuit in synchronization with the sampling clock signal that is delayed, and output a digital signal corresponding to an amplitude of the output signal that is sampled; and
    a delay adjustment circuit configured to adjust a delay time of the sampling clock signal in the delay circuit in accordance with a change in frequency of the sampling clock signal.

2. The analog-to-digital converter according to claim 1, wherein
    the delay adjustment circuit is configured to adjust the delay time such that the analog-to-digital converter circuit samples the output signal in a stable region in which the output signal of the sample-and-hold circuit is stable.

3. The analog-to-digital converter according to claim 1, wherein
    the delay adjustment circuit is configured to shorten the delay time in accordance with an increase in frequency of the sampling clock signal, and extend the delay time in accordance with a decrease in frequency of the sampling clock signal.

4. The analog-to-digital converter according to claim 1, wherein
    the frequency of the sampling clock signal is less than a Nyquist frequency being two times the highest frequency of the analog input signal, and
    the analog-to-digital converter is configured to perform analog-to-digital conversion on the analog input signal in a radio frequency band and convert the analog input signal to a signal in a frequency band lower than the radio frequency band.

5. The analog-to-digital converter according to claim 2, wherein
    the stable region is a region near a center of a holding period in which the sample-and-hold circuit holds a signal obtained by sampling the analog input signal, the region near the center excluding a start timing and an end timing.

6. A wireless communication apparatus comprising the analog-to-digital converter according to claim 1.

7. An analog-to-digital conversion method, comprising:
    sampling and holding an analog input signal in synchronization with a sampling clock signal;
    delaying the sampling clock signal;
    sampling the signal that is held in synchronization with the sampling clock signal that is delayed, and outputting a digital signal corresponding to an amplitude of the signal that is sampled; and
    adjusting a delay time of the sampling clock signal in a case where the sampling clock signal is to be delayed, in accordance with a change in frequency of the sampling clock signal.

* * * * *